(12) United States Patent
Kimura et al.

(10) Patent No.: US 10,411,174 B2
(45) Date of Patent: Sep. 10, 2019

(54) SEMICONDUCTOR LIGHT-EMITTING DEVICE AND OPTICAL-SEMICONDUCTOR-MOUNTING SUBSTRATE

(71) Applicant: DAI NIPPON PRINTING CO., LTD., Tokyo (JP)

(72) Inventors: Aki Kimura, Tsukuba (JP); Katsuya Sakayori, Fujimono (JP); Kei Amagai, Tsukuba (JP); Satoru Kanke, Tsukuba (JP); Toshiyuki Sakai, Tsukubamirai (JP); Toshimasa Takarabe, Tokyo (JP); Makoto Mizoshiri, Tsukuba (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/129,848

(22) PCT Filed: Mar. 27, 2015

(86) PCT No.: PCT/JP2015/059784
§ 371 (c)(1),
(2) Date: Sep. 28, 2016

(87) PCT Pub. No.: WO2015/152097
PCT Pub. Date: Oct. 8, 2015

(65) Prior Publication Data
US 2017/0207376 A1  Jul. 20, 2017

(30) Foreign Application Priority Data

Mar. 31, 2014 (JP) ................................. 2014-074828
Jan. 30, 2015 (JP) ................................. 2015-017933

(51) Int. Cl.
*H01L 33/60* (2010.01)
*H01L 33/48* (2010.01)
(Continued)

(52) U.S. Cl.
CPC .............. *H01L 33/60* (2013.01); *H01L 24/97* (2013.01); *H01L 33/30* (2013.01); *H01L 33/32* (2013.01);
(Continued)

(58) Field of Classification Search
None
See application file for complete search history.

(56) References Cited

U.S. PATENT DOCUMENTS

2009/0123698 A1* 5/2009 Nishino ................ C03C 17/008
428/141
2011/0241048 A1* 10/2011 Taguchi .................. H01L 33/60
257/98
(Continued)

FOREIGN PATENT DOCUMENTS

JP   2011-195709 A   10/2011
JP   5060707 B2      10/2012
(Continued)

OTHER PUBLICATIONS

May 19, 2015 Search Report issued in International Patent Application No. PCT/JP2015/059784.

*Primary Examiner* — Nishath Yasmeen
(74) *Attorney, Agent, or Firm* — Oliff PLC

(57) ABSTRACT

A semiconductor light-emitting device including at least a substrate, a reflector having a concave cavity, and an optical semiconductor element, wherein the reflector is formed of a resin composition containing an inorganic substance; in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is 0.01

(Continued)

or more and 1.0 or less; and an ash content of the reflector is 60% by mass or more. A semiconductor light-emitting device and an optical-semiconductor-mounting substrate, including a reflector having an extremely high light reflection property and excellent dimensional stability.

24 Claims, 1 Drawing Sheet

(51) Int. Cl.
*H01L 33/58* (2010.01)
*H01L 33/62* (2010.01)
*H01L 23/00* (2006.01)
*H01L 33/30* (2010.01)
*H01L 33/32* (2010.01)
*H01L 33/50* (2010.01)
*H01L 33/56* (2010.01)

(52) U.S. Cl.
CPC .......... *H01L 33/486* (2013.01); *H01L 33/502* (2013.01); *H01L 33/56* (2013.01); *H01L 33/58* (2013.01); *H01L 33/62* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 2224/97* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| 2013/0200777 | A1* | 8/2013 | Inagaki | C09K 11/7734 |
| | | | | 313/502 |
| 2014/0293620 | A1* | 10/2014 | Mizuno | F21V 7/22 |
| | | | | 362/341 |

FOREIGN PATENT DOCUMENTS

| JP | 2013-166926 | | * | 3/2013 | | |
| JP | 2014-199285 | A | * | 3/2013 | | |
| JP | 2013-077794 | A | | 4/2013 | | |
| JP | 2013-166926 | | * | 8/2013 | | |
| JP | 2013-166926 | A | | 8/2013 | | |
| JP | 2013166926 | A | * | 8/2013 | ............ | H01L 33/60 |
| JP | 2013-232532 | A | | 11/2013 | | |
| JP | 2013-243294 | A | | 12/2013 | | |
| JP | 2013-249239 | A | | 12/2013 | | |
| JP | 2014199285 | A | * | 10/2014 | ............ | F21V 7/22 |
| WO | 2011/027562 | A1 | | 3/2011 | | |

* cited by examiner

SEMICONDUCTOR LIGHT-EMITTING DEVICE AND OPTICAL-SEMICONDUCTOR-MOUNTING SUBSTRATE

TECHNICAL FIELD

The present invention relates to a semiconductor light-emitting device and an optical-semiconductor-mounting substrate.

BACKGROUND ART

An LED (Light Emitting Diode) element, which is one of semiconductor light-emitting elements, is small in size, has a long life, and has an excellent power saving property. Therefore, it is widely used as a light source of an indicating lamp and the like. Further, in recent years, LED elements having higher luminance have come to be produced at relatively low cost and, accordingly, use of the LED element as a light source to replace fluorescent lamps and incandescent light bulbs is under consideration. When using the LED element as such a light source, in order to obtain large luminance, many of surface-mounted LED packages employ a method wherein LED elements are disposed on a substrate (LED-mounting substrate) comprising a conductive material, on which surface is formed a substance which reflects light such as silver and the like, and wherein a reflector (reflecting body) which reflects light to a prescribed direction is arranged around each LED element.

Incidentally, the semiconductor light-emitting element, such as the LED element used for a semiconductor light-emitting device, accompanies heat generation at the time of light emission and, therefore, there have been cases where the reflector deteriorates due to a temperature rise of the element, resulting in lowering of reflectance thereof, and a decrease in luminance of light emitted by the LED package.

Thus, heat resistance is required of the reflector and, therefore, a development of a reflector having improved heat resistance is progressing. For example, Patent Literature 1 proposes a thermosetting resin composition for light reflection, comprising (A) an epoxy resin, (B) a curing agent, (C) a curing catalyst, (D) inorganic filler, (E) a white pigment, and (F) a coupling agent.

Patent Literature 2 proposes a polyamide composition comprising a polyamide having dicarboxylic acid units containing 50 to 100 mole % of 1,4-cyclohexanedicarboxylic acid units and diamine units containing 50 to 100 mole % of C4-18 aliphatic diamine units.

Patent Literature 3 proposes a resin composition comprising (A) a fluorine resin having carbon-hydrogen bonds and (B) titanium oxide. Furthermore, Patent Literature 4 proposes even an electron beam-curable resin composition containing a specific cross-linking agent, and proposes a semiconductor light-emitting device in which the resin composition is used for the reflector.

Heretofore, as a method for mounting the semiconductor light-emitting device on a wiring substrate and the like, there has been employed a method (reflow method) where the semiconductor light-emitting device is temporarily fixed on the wiring substrate having solder applied beforehand in spots on predetermined places, and thereafter the semiconductor light-emitting device is fixed by using the solder melted by heating the wiring substrate generally to around 220 to 270° C. by means of infrared rays, hot air, and the like.

However, the semiconductor light-emitting devices which have conventionally been used are not necessarily sufficient in heat resistance, and particularly in the reflow process by heating, there are such problems that temperature of a component surface rises locally to cause a deformation; and the like. If the shape of the reflector changes, a reflection angle of light and the like also change, and thus it becomes difficult for the LED package to exhibit light-emitting characteristics as designed. Further, external dimensions of the LED package change to cause a defect in connection of the package to the wiring substrate. Therefore, there has been a desire for a semiconductor light-emitting device which is provided with a reflector having excellent dimensional stability to heat.

CITATION LIST

Patent Literature

[PTL 1] Japanese Patent No. 5060707
[PTL 2] International Publication No. WO 2011/027562
[PTL 3] Japanese Patent Laid-Open Publication No. 2011-195709
[PTL 4] Japanese Patent Laid-Open Publication No. 2013-166926

SUMMARY OF INVENTION

Technical Problem

An object of the present invention is to provide a semiconductor light-emitting device and an optical-semiconductor-mounting substrate, comprising a reflector having an extremely high light reflection property and, further, excellent dimensional stability to heat. In addition, the "dimensional stability" here means an amount of dimensional shrinkage of the reflector in a heat treatment process at high temperature during mounting thereof on the substrate, where the mounting includes fixing of the device by melting the solder, and the like. The smaller this value is, the smaller is the shape change of the semiconductor light-emitting device such as an LED package and the like after mounting on the wiring substrate, and the more stable are light-emitting characteristics and light directivity exhibited. As a result, the dimensional stability can serve as an index for improvement of long-term reliability. In order to obtain long-term reliability sufficient as the reflector, the dimensional stability is preferably at least 1% or less.

Solution to Problem

The present inventors conducted diligent research in order to achieve the above objects, and as a result found the following. That is, the problem can be solved by a semiconductor light-emitting device comprising at least a substrate, a reflector having a concave cavity, and an optical semiconductor element, wherein the reflector is formed of a resin composition containing an inorganic substance; in a spectrum obtained when the reflector is measured by an X-ray diffraction method using CuKα radiation (wavelength=1.5418 Å), an intensity ratio of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is set in a specific range; and an ash content of the reflector is set at 60% by mass or more. The present invention was completed based on these findings.

That is, the present invention provides:
(1) a semiconductor light-emitting device comprising at least a substrate, a reflector having a concave cavity, and an optical semiconductor element, wherein the reflector is formed of a resin composition containing an inorganic substance; in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is 0.01 or more and 1.0 or less; and an ash content of the reflector is 60% by mass or more; and
(2) an optical-semiconductor-mounting substrate comprising a substrate and a reflector having a concave cavity, wherein the reflector is formed of a resin composition containing an inorganic substance; in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is 0.01 or more and 1.0 or less; and an ash content of the reflector is 60% by mass or more.

Advantageous Effects of Invention

The semiconductor light-emitting device of the present invention comprises a reflector, which is a component thereof, having an extremely high light reflection property, and has excellent dimensional stability to heat. Thus, the present invention can provide a semiconductor light-emitting device and an optical-semiconductor-mounting substrate which exhibit light orientation characteristics as designed and maintain high reliability over a long period of time.

DESCRIPTION OF EMBODIMENTS

Figure 1:
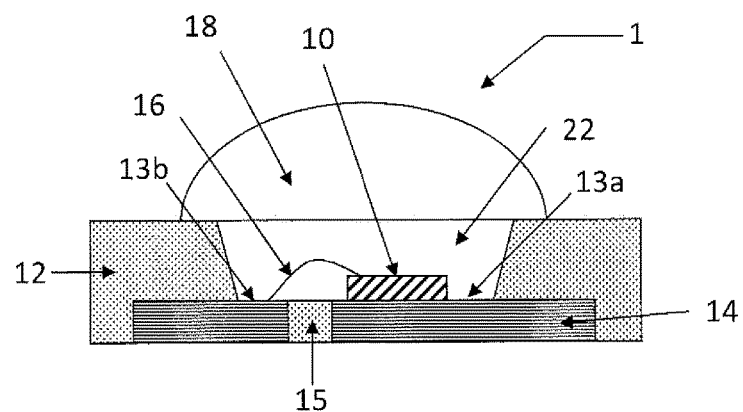
FIG. 1 is a schematic view showing the semiconductor light-emitting device of the present invention.

The semiconductor light-emitting device of the present invention will be described in detail with reference to FIG. 1.

The semiconductor light-emitting device 1 of the present invention comprises a reflector 12 having a concave cavity, at least one optical semiconductor element 10 disposed on a bottom surface of the concave, a pad portion 13a for mounting the optical semiconductor element, and a substrate 14 having a lead portion 13b for electrically connecting to the optical semiconductor element. The optical semiconductor element mounted on the pad portion is electrically connected to the lead portion by means of a lead wire 16.

Furthermore, the cavity may be a vacant space but, from the viewpoints of preventing electrical malfunctions and protecting the optical semiconductor element from moisture, dust, and the like, it is preferably filled with a resin (sealing resin) which can seal the optical semiconductor element and, at the same time, transmit the light emitted from the optical semiconductor element to the outside. The sealing resin may contain, when necessary, a substance which converts a wavelength of light, such as a fluorescent material and the like. Moreover, there may be installed a lens 18 on the reflector 12 in order to condense light emitted from the optical semiconductor element. The lens is usually made of a resin, and various structures are employed depending on the purpose, use, and the like. The lens may also be colored if necessary.

In the following, each member will be described in detail.
<Substrate>
The substrate 14 in the semiconductor light-emitting device 1 of the present invention is a thin plate made of metal, which is also called a lead frame, and materials used mainly includes metal (pure metal or alloy) such as, for example, aluminum, copper, an alloy of copper-nickel-tin, an alloy of iron-nickel, and the like. Also, the substrate may have a light reflection layer which is formed in such a way that it covers a portion or all of front and rear surfaces of the substrate. The light reflection layer desirably has a high reflection function to reflect the light from the optical semiconductor element. Specifically, the light reflection layer has reflectance, for electromagnetic waves having a wavelength of 380 nm or more and 800 nm or less, of preferably 65% or more and 100% or less at each wavelength, more preferably 75% or more and 100% or less, and even more preferably 80% or more and 100% or less. When the reflectance is high, loss of light emitted from the LED element is slight, and luminous efficiency as an LED package becomes high.

As a material of the light reflection layer, there may be mentioned, for example, silver or an alloy containing silver, but a content ratio of silver therein is preferably 60% by mass or more. When the content ratio of silver is 60% by mass or more, there can be obtained a sufficient reflection function. From the same viewpoint, the content ratio of silver is more preferably 70% by mass or more, and even more preferably 80% by mass or more.

Meanwhile, thickness of the light reflection layer is desirably 1 to 20 μm. When the thickness of the light reflection layer is 1 μm or more, a sufficient reflection function is obtained. When the thickness is 20 μm or less, there are obtained an advantage in terms of cost as well as improved workability.

Thickness of the substrate is not particularly limited, but is preferably in a range of 0.1 to 1.0 mm. When the thickness of the substrate is 0.1 mm or more, the substrate has high strength, and is hard to deform. On the other hand, when the thickness is 1.0 mm or less, the substrate is easy to fabricate. From the same viewpoints, the thickness of the substrate is more preferably in a range of 0.15 to 0.5 mm.

The substrate is formed from a plate material made of metal through processes such as etching, press working, and the like, and has a pad portion for loading thereon an optical semiconductor element such as an LED chip or the like, and a lead portion which supplies electric power to the optical semiconductor element. The pad portion and the lead portion are insulated, and the optical semiconductor element becomes connected to the lead portion by means of a lead wire through processes of wire bonding, chip bonding, and the like.
<Reflector>
The reflector 12 has a function of reflecting light from the optical semiconductor element in the direction of a light emission portion (in FIG. 1, the direction of the lens 18).

The reflector pertaining to the present invention is formed of a resin composition containing an inorganic substance; in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is 0.01 or more and 1.0 or less; and an ash content of the reflector is 60% by mass or more.

In a spectrum obtained when the reflector of the present invention is measured by an X-ray diffraction method using CuKα radiation (wavelength=1.5418 A), the presence of diffraction peaks in a range of 2θ of 0° to 24° means that, in the resin composition which forms the reflector of the present invention, there is contained a region where molecular chains of the resin are oriented with regularity (crystallized). Such resins include, for example, crystalline resins such as polyethylene, polypropylene, polymethylpentene, polyethylene oxide, polyamide, polyacetal, polyethylene terephthalate, polyphenylene sulfide, and the like; and cross-linked materials thereof.

By using a resin composition containing a crystallized region, there can be obtained a reflector which has excellent fatigue resistance, chemical resistance, and mechanical characteristics. The resin composition which forms the reflector of the present invention may contain a resin having a crystalline region alone, or the resin composition may be a mixture containing a plurality of resins each having crystalline region. Further, the resin composition may contain, in addition to the resin(s) each containing the crystallized region(s), other resins including non-crystalline resins may be contained in a range that does not interfere with the effect of the present invention.

Resins which tend to crystallize easily include hydrocarbon-based resins. As for a hydrocarbon-based resin, for example, in the case of polyethylene, it has a diffraction peak at 2θ=21.7±1° in a range of 2θ of 0° to 24°. In the case of polypropylene, in a range of 2θ of 0° to 24°, any one of peaks at 2θ=14.1±1°, 2θ=17.1±1°, 2θ=18.5±1°, and 2θ=21.8±1° becomes the highest intensity diffraction peak. In the case of polymethylpentene, it has peaks at 2θ=9.3±1°, 13.4±1°, 16.7±1°, and 18.3±1°, any one of which becomes the highest intensity diffraction peak.

Among the resins containing crystallized regions, those having the above diffraction peaks, i.e. the hydrocarbon-based resins, show improved molding workability and resistance to light.

The crystallized resin contained in the resin composition which forms the reflector of the present invention is not particularly limited but it has, among the diffraction peaks in a range of 2θ of 0° to 24°, the highest intensity diffraction peak preferably at any one of 2θ=9.3±1°, 13.4±1°, 16.7±1°, and 18.3±1°, and more preferably it has at least a combination of diffraction peaks at 2θ=13.4±1°, 16.7±1°, and 18.3±1°. When polymethylpentene is included as the crystallized resin contained in the resin composition which forms the reflector, the resin composition has diffraction peaks, in a range of 2θ of 0° to 24°, at 9.3±1°, 13.4±1°, 16.7±1°, and 18.3±1°. The resin composition containing polymethylpentene not only has excellent moldability, workability, and heat resistance, but also has high transparency. Therefore, even when it is mixed, impediment of optical characteristics such as transmittance, reflectance, and the like can be suppressed.

The above diffraction peaks at 2θ=9.3±1°, 13.4±1°, 16.7±1°, and 18.3±1° are respectively ascribed to (200) face, (220) face, (212) face, and (312) face of polymethylpentene.

An intensity ratio of these diffraction peaks varies according to orientation of a main chain of a polymethylpentene molecule. Further, particularly preferable is a case when, among the diffraction peaks ascribed to polymethylpentene, the highest intensity diffraction peak corresponds to a diffraction peak at 2θ=9.3±1°, which is ascribed to (200) face, because in that case, dimensional stability is improved.

The polymethylpentene contained in the resin composition which forms the reflector may be either a homopolymer of 4-methylpentene-1, or a copolymer of 4-methylpentene-1 with other α-olefins, for example, C2-20 α-olefins such as ethylene, propylene, and the like. Furthermore, the polymethylpentene may be a cross-linked material.

On the other hand, in a spectrum obtained when the reflector of the present invention is measured by an X-ray diffraction method using CuKα radiation (wavelength=1.5418 A), diffraction peaks in a range of 2θ of more than 24° to 70° are derived from an inorganic substance contained in the resin composition which forms the reflector of the present invention.

The inorganic substance contained in the resin composition which forms the reflector of the present invention is not particularly limited but it has, among the diffraction peaks in a range of 2θ of more than 24° to 70°, the highest intensity diffraction peak preferably at any one of 2θ=27.4±1°, 36.1±1°, 41.2±1°, 54.3±1°, 56.6±1°, 69.0±1°, 25.3±1°, 37.9±1°, 48.1±1°, 54.0±1°, 55.1±1°, 62.7±1°, 25.3±1°, 25.7±1°, 30.8±1°, 36.3±1°, 48.0±1°, 54.2±1°, and 55.2±1°, more preferably it has any combination of the following (1) to (3):

(1) a combination of diffraction peaks at least at 2θ=27.4±1°, 36.1±1°, 41.2±1°, 54.3±1°, 56.6±1°, and 69.0±1°;
(2) a combination of diffraction peaks at least at 2θ=25.3±1°, 37.9±1°, 48.1±1°, 54.0±1°, 55.1±1°, and 62.7±1°; and
(3) a combination of diffraction peaks at least at 2θ=25.3±1°, 25.7±1°, 30.8±1°, 36.3±1°, 48.0±1°, 54.2±1°, and 55.2±1°.

When the resin composition shows, in a range of 2θ of more than 24° to 70°, diffraction peaks at 2θ=27.4±1°, 36.1±1°, 41.2±1°, 54.3±1°, 56.6±1°, and 69.0±1°; 25.3±1°, 37.9±1°, 48.1±1°, 54.0±1°, 55.1±1°, and 62.7±1°; or 25.3±1°, 25.7±1°, 30.8±1°, 36.3±1°, 48.0±1°, 54.2±1°, and 55.2±1°, it means that titanium oxide is included as the inorganic substance contained in the resin composition which forms the reflector. A resin composition containing titanium oxide can acquire a high reflection property.

Intensity and peak positions of diffraction peaks derived from titanium oxide differ according to the crystal form of titanium oxide. The diffraction peaks in the aforementioned (1) at 2θ=27.4±1°, 36.1±1°, 41.2±1°, 54.3±1°, 56.6±1°, and 69.0±1° are ascribed, respectively, to (110) face, (101) face, (111) face, (211) face, (220) face, and (301) face of a rutile type crystal of titanium oxide. Further, the diffraction peaks in the aforementioned (2) at 2θ=25.3±1°, 37.9±1°, 48.1±1°, 54.0±1°, 55.1±1°, and 62.7±1° are ascribed, respectively, to (101) face, (004) face, (200) face, (105) face, (211) face, and (204) face of an anatase type crystal of titanium oxide. Furthermore, the diffraction peaks in the aforementioned (3) at 2θ=25.3±1°, 25.7±1°, 30.8±1°, 36.3±1°, 48.0±1°, 54.2±1°, and 55.2±1° are ascribed, respectively, to (120) face, (111) face, (121) face, (012) face, (231) face, (320) face, and (241) face of a brookite type crystal of titanium oxide.

Furthermore, in the case of the rutile type, there is the highest intensity diffraction peak at 2θ=27.4±1°. In the case of the anatase type and brookite type, the highest diffraction peak appears at 2θ=25.3±1° in both cases.

Among these, the crystal form of titanium oxide, contained as the inorganic substance in the resin composition which forms the reflector, preferably is the rutile type, because it provides not only high thermal stability, but also, in particular, a high reflection property. That is, among the diffraction peaks derived from titanium oxide, the largest intensity diffraction peak is preferably a diffraction peak at $2\theta=27.4\pm1°$, which is ascribed to (110) face of a rutile type crystal.

In the present invention, it is essential that the above-mentioned peak intensity ratio (P1/P2) is 0.01 or more and 1.0 or less. When the peak intensity ratio (P1/P2) is less than 0.01, the reflector becomes brittle and, when it exceeds 1.0, sufficient dimensional stability cannot be obtained. From the above viewpoints, the peak intensity ratio (P1/P2) is preferably in a range of 0.05 or more and 0.75 or less, and more preferably in a range of 0.1 or more and 0.5 or less.

As to an average particle size of the titanium oxide contained in the resin composition which forms the reflector of the present invention, in consideration of moldability and from the viewpoint of obtaining high reflectance, its primary particle size is preferably 0.05 to 0.50 μm, more preferably 0.10 to 0.40 μm, and even more preferably 0.15 to 0.30 μm. Meanwhile, the average particle size of titanium oxide can be obtained, for example, as a mass average value D50 in a particle size distribution measurement by a laser optical diffraction method.

(Measurement of Diffraction Peak Intensity Ratio (P1/P2))

The diffraction peak intensity ratio (P1/P2) of the reflector of the present invention can be measured by means of an X-ray diffraction apparatus. As a shape of a measurement specimen, the reflector alone is cut out from the semiconductor light-emitting device or the optical-semiconductor-mounting substrate of the present invention, or the semiconductor light-emitting device or the optical-semiconductor-mounting substrate can be used as is. These are placed on a sample table and X-ray diffraction measurements are performed under the following conditions. Hereat, in order to exclude influence due to amorphous halo peaks, wave forms having a half-value width of $2\theta=6°$ or less are defined as diffraction peaks in the obtained spectra. Further, the peak intensity P1 and P2 are integrated values of respective diffraction peaks.

X-Ray Diffraction Measurement Conditions:
  Radiation source; CuKα radiation (wavelength=1.5418 A)
  Scanning axis; 2θ/θ
  Tube voltage; 45 kV
  Tube current; 200 mA
  Slit; soller slit 5.0°
  Scanning speed; 5.5°/min
  Scanning step; 0.05°

Moreover, it is essential that the reflector of the present invention has an ash content of 60% by mass or more. When the ash content is less than 60% by mass, there cannot be obtained sufficient reflection property, mechanical characteristics, and dimensional stability for a reflector. From the above viewpoint, the ash content is preferably 70% by mass or more, and more preferably 75% by mass or more.

(Measurement of Ash Content)

As for the ash content of the reflector of the present invention, there can be used as a measurement sample the reflector alone cut out from the semiconductor light-emitting device or an optical-semiconductor-mounting substrate, and can be measured by a method according to a method (JIS K 7250-1 (ISO 3451-1)) specified as a method to determine an ash content of a general resin composition or a method in accordance therewith, or according to a TG-DTA method. Among these measurement methods, it is preferable to measure by JIS K 7250.1 (ISO 3451-1) and a method in accordance therewith. However, JIS K 7250.1 (ISO 3451-1) and a method in accordance therewith require a very large amount of sample, and when a sufficient amount of sample cannot be obtained, the ash content may be measured by the TG-DTA method.

In the following, measurement conditions for ash content are described:
(1) JIS K 7250-1 (ISO 3451-1)
Method a (Direct Ashing Method)
  Ashing temperature; 800° C.
  Ashing time; 2 hours
(2) TG-DTA Method By using a thermal gravimetric-differential thermal analyzer (TG-DTA), a mass of the measurement sample is weighed, and thereafter the sample is ashed by raising the temperature at a rate of 10° C./min to 600° C. under an air atmosphere in an aluminum pan, and by heating the sample as is at 600° C. for 30 minutes. A mass after the heating relative to the mass before the heating is represented in percentage, which value is taken as the ash content.

Meanwhile, by the measurement of the ash content, it becomes possible to know a weight ratio of all inorganic substances in the resin composition which forms the reflector, the inorganic substances including an inorganic substance whose diffraction peak does not appear in the X-ray diffraction method. By using a resin composition containing the inorganic substance(s), there can be obtained a reflector having excellent reflection property, mechanical characteristics, and dimensional stability.

Among the inorganic substances contained in the resin composition which forms the reflector of the present invention, one having an effect of providing a high reflection property includes, for example, titanium oxide, zinc sulfide, zinc oxide, barium sulfide, potassium titanate, or the like. These may be contained alone or as a mixture but, from the viewpoint of obtaining a high reflection property, it is preferable that titanium oxide is contained, and it is more preferable that a crystal form thereof is the rutile type.

On the other hand, as an inorganic substance having an effect of providing high mechanical characteristics and dimensional stability, there can be used one which is generally used for reinforcing resins. Specifically, there may be mentioned oxides such as silica; hydroxides such as calcium hydroxide; carbonates such as calcium carbonate; sulfates such as barium sulfate; silicates such as talc, mica, and wollastonite; and the like. Each of these has various shapes such as a particle-like shape, a fiber-like shape, a modified cross section fiber-like shape, a shape having large surface roughness, and a thin flake-like shape.

These may be contained alone or as a mixture. The inorganic substance, contained in the resin composition which forms the reflector of the present invention and having an effect of providing high mechanical characteristics and dimensional stability, is not particularly limited, but it preferably comprises silica particles or glass fibers from the viewpoints of transparency, toughness, and the like.

In addition, these have characteristics that their diffraction peaks are hard to be detected in the X-ray diffraction measurements. However, they can be detected as a weight ratio of all inorganic substances including those whose diffraction peaks can be detected in the X-ray diffraction measurements.

[Dispersant]

In addition to the above materials, the resin composition which forms the reflector of the present invention may contain a dispersant mixed in a range that does not interfere with the effect of the present invention. As the dispersant, there may be used one which is generally used for a resin composition containing an inorganic substance, but preferable is a silane coupling agent. The silane coupling agent imparts the inorganic substance with high dispersibility into and has high compatibility with the resin, and can provide the reflector with high mechanical characteristics and dimensional stability.

The silane coupling agents include, for example: disilazanes such as hexamethyldisilazane and the like; cyclic silazanes; alkylsilane compounds such as trimethylsilane, trimethylchlorosilane, dimethyldichlorosilane, methyltrichlorosilane, allyldimethylchlorosilane, trimethoxysilane, benzyldimethylchlorosilane, methyltrimethoxysilane, methyltriethoxysilane, isobutyltrimethoxysilane, dimethyldimethoxysilane, dimethyldiethoxysilane, trimethylmethoxysilane, hydroxypropyltrimethoxysilane, phenyltrimethoxysilane, n-butyltrimethoxysilane, n-hexadecyltrimethoxysilane, n-octadecyltrimethoxysilane, vinyltrimethoxysilane, vinyltriethoxysilane, propenyltrimethoxysilane, propenyltriethoxysilane, butenyltrimethoxysilane, butenyltriethoxysilane, pentenyltrimethoxysilane, pentenyltriethoxysilane, hexenyltrimethoxysilane, hexenyltriethoxysilane, heptenyltrimethoxysilane, heptenyltriethoxysilane, octenyltrimethoxysilane, octenyltriethoxysilane, nonenyltrimethoxysilane, nonenyltriethoxysilane, decenyltrimethoxysilane, decenyltriethoxysilane, undecenyltrimethoxysilane, undecenyltriethoxysilane, dodecenyltrimethoxysilane, dodecenyltriethoxysilane, γ-methacryloxypropyltrimethoxysilane, vinyltriacetoxysilane, and the like; aminosilane compounds such as γ-aminopropyltriethoxysilane, γ-(2-aminoethyl)aminopropyltrimethoxysilane, γ-(2-aminoethyl) aminopropylmethyldimethoxysilane, N-phenyl-3-aminopropyltrimethoxysilane, N-(2-aminoethyl)-3-aminopropyltrimethoxysilane, N-ß-(N-vinylbenzylaminoethyl)-γ-aminopropyltrimethoxysilane, hexyltrimethoxysilane, and the like; and the like.

[Cross-Linking Agent]

In addition to the above materials, the resin composition which forms the reflector of the present invention may contain a cross-linking agent mixed in a range that does not interfere with the effect of the present invention. As the cross-linking agent, preferable is one having a saturated or unsaturated cyclic structure, and also having a structure wherein at least one atom among atoms which form at least one ring is bonded to any one of allyl-based substituents including an allyl group, a methacryl group, an allyl group via a linking group, and a methacryl group via a linking group.

A cross-linking agent having such a structure exhibits good electron beam curability particularly by being used together with an electron beam curable resin, and can impart excellent dimensional stability to the reflector.

The saturated or unsaturated cyclic structure includes cyclo rings, hetero rings, aromatic rings, and the like. The number of atoms which form the ring structure is preferably 3 to 12, more preferably 5 to 8, and even more preferable is that the ring is 6-membered. Furthermore, the linking group includes ester bonds, ether bonds, alkylene groups, (hetero) arylene groups, and the like.

More specifically, the cross-linking agent includes triallyl isocyanurate, methyldiallyl isocyanurate, diallylmonoglycidyl isocyanurate, monoallyldiglycidyl isocyanurate, trimethallyl isocyanurate, a diallyl ester of orthophthalic acid, a diallyl ester of isophthalic acid, or the like.

A molecular weight of the cross-linking agent is, from the viewpoints of good dispersibility in the resin composition and initiation of an effective cross-linking reaction, preferably 1000 or less, more preferably 500 or less, and even more preferably 300 or less. In addition, the number of ring structures is preferably 1 to 3, more preferably 1 or 2, and even more preferably 1.

Further, a content of the cross-linking agent is preferably 0.5 to 40 parts by mass relative to 100 parts by mass of the resin. When the content is in this range, the cross-linking agent does not bleed out and can provide the resin composition with good curability. From the above viewpoints, the content of the cross-linking agent is more preferably 1 to 30 parts by mass, and particularly preferably 5 to 20 parts by mass.

[Other Additives]

In addition to the above materials, the resin composition which forms the reflector of the present invention may contain various additives in a range that does not interfere with the effect of the present invention. For example, in order to improve properties of the resin composition, there can be added additives including: internal release agents such as various whiskers, silicone powder, thermoplastic elastomers, organic synthetic rubber, fatty esters, glycerin esters, zinc stearate, calcium stearate, and the like; antioxidants such as benzophenone types, salicylic acid types, cyanoacrylate types, isocyanurate types, oxalic acid anilide types, benzoate types, hindered amine types, benzotriazole types, phenol types, and the like; light stabilizers such as hindered amine types, benzoate types, and the like.

[Preparation of Resin Composition for Reflector]

The resin composition which forms the reflector of the present invention can be prepared by mixing, in a predetermined ratio, the resin, the inorganic substance, and the cross-linking agent and other additives which are added as necessary. As a method for mixing, there can be applied known means such as: stirrers such as a twin roll, a triple roll, a homogenizer, a planetary mixer, a biaxial kneading extruder, and the like; melt extruders such as Polylabo System, Laboplast Mill, and the like; and the like. These may be operated at ordinary temperature, or under a cooled state, a heated state, atmospheric pressure, a reduced pressure state, or a pressurized state.

[Shape of Reflector]

The shape of the reflector 12 follows the shape of an end portion (joint portion) of the lens 18, and is usually cylindrical or ring-shaped including a square shape, a circular shape, an oval shape, or the like. In the rough cross-sectional view of FIG. 1, the reflector 12 is a cylindrical body (ring-shaped body) and a whole end surface of the reflector 12 is in contact with and fixed to the surface of the substrate 14.

Furthermore, the reflector 12 has a shape having a concave cavity, and an inner surface of the reflector 12 may be enlarged upward in a tapered shape in order to increase directivity of light from the optical semiconductor element 10.

Further, the reflector 12 can be made to function also as a lens holder, when its end portion on the lens 18 side is fabricated in a shape corresponding to the shape of the lens 18.

[Method for Manufacturing Reflector]

A method for manufacturing a reflector pertaining to the present invention is not particularly limited, but it is preferably manufactured by injection molding using the resin composition. Hereat, from the viewpoint of moldability, the cylinder temperature is preferably 200 to 400° C., and more preferably 220 to 320° C. Furthermore, the mold temperature is preferably 10 to 170° C., and more preferably 20 to 150° C.

The reflector pertaining to the present invention may, further if necessary, be subjected to an ionizing radiation irradiation treatment before or after the molding process, wherein, above all, an electron beam irradiation treatment is preferable. By providing an electron beam irradiation treatment, mechanical characteristics and dimensional stability of the reflector can be improved.

[Sealing Resin]

The cavity of the reflector pertaining to the present invention is preferably sealed by a resin (sealing resin) which can seal the optical semiconductor element and can transmit light emitted from the optical semiconductor element to the outside. The sealing resin enables, in wire-bonding mounting, prevention of electrical defects caused by a lead wire which may, due to force exerted by a direct contact with the lead wire, indirect vibration, impact, and the like, come off from a joint portion with an optical semiconductor element and/or a joint portion with an electrode, be cut, or short circuit. Furthermore, at the same time, the sealing resin can protect the optical semiconductor element from moisture, dust, and the like, and can maintain reliability thereof for a long period.

Materials used as the sealing resin are not particularly limited, but include silicone resins, epoxy silicone resins, epoxy-based resins, acrylic resins, polyimide-based resins, polycarbonate resins, and the like. Among these, from the viewpoints of heat resistance, weather resistance, low shrinkage, and color fastness, preferable are the silicone resins. Furthermore, the sealing resin may, as necessary, contain a substance which converts wavelength of light, such as a fluorescent material or the like.

<Optical Semiconductor Element>

The optical semiconductor element is a semiconductor chip (luminous body) which emits radiated light (in general, UV or blue light in a white light LED), having a double hetero structure wherein an active layer comprising AlGaAs, AlGaInP, GaP, or GaN is sandwiched by n-type and p-type clad layers. The optical semiconductor element has, for example, a hexahedral structure with one side having a length of about 0.5 mm. And in the case of wire-bonding mounting, the optical semiconductor element is connected to a lead portion via a lead wire.

<Optical-Semiconductor-Mounting Substrate>

The optical-semiconductor-mounting substrate of the present invention is suitably used for the semiconductor light-emitting device, and comprises the substrate 14 and the reflector 12 having a concave cavity. The reflector, as described above, is formed of a resin composition containing an inorganic substance; in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is 0.01 or more and 1.0 or less; and an ash content of the reflector is 60% by mass or more.

<Method for Manufacturing Optical-Semiconductor-Mounting Substrate>

Figure 2:
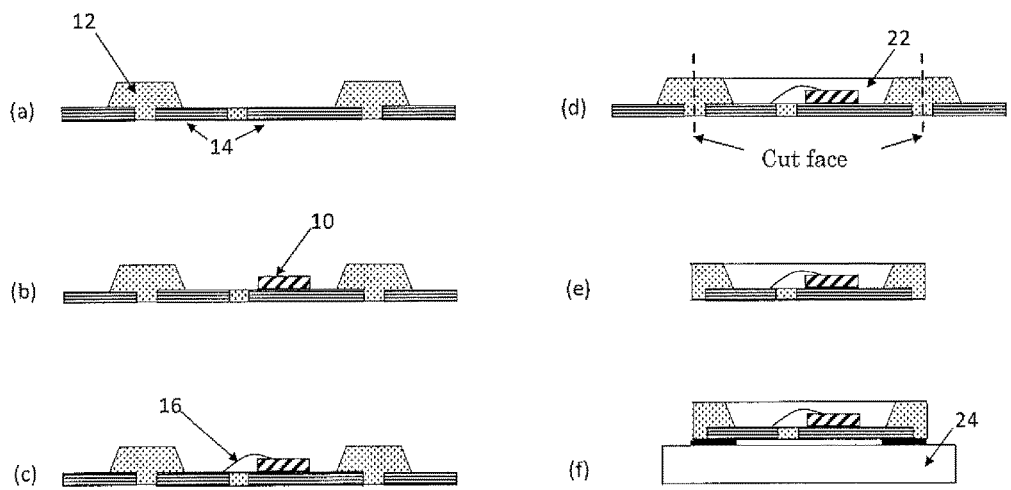
FIG. 2 is a schematic view of a production process of the semiconductor light-emitting device and the optical-semiconductor-mounting substrate of the present invention.

One example of a method for manufacturing the optical-semiconductor-mounting substrate of the present invention will be described with reference to FIG. 2, but the method for manufacturing the optical-semiconductor-mounting substrate of the present invention is not limited in any way by this example.

First, a resin composition for forming a reflector is molded on the substrate 14 (metal frame or lead frame) by transfer molding, compression molding, injection molding, or the like using a mold provided with cavity spaces of a predetermined shape to obtain a molded body having a plurality of reflectors of a predetermined shape. This method is efficient because it enables preparation of a plurality of reflectors concurrently, and injection molding is the preferable method. The molded body thus obtained may, as necessary, go through a curing process such as electron beam irradiation and the like. The product at this step, that is, the one having a reflector mounted on a substrate is the optical-semiconductor-mounting substrate (FIG. 2 (a)).

<Method for Manufacturing Semiconductor Light-Emitting Device>

Next, one example of a method for manufacturing the semiconductor light-emitting device of the present invention will be described with reference to FIG. 2, but the method for manufacturing the semiconductor light-emitting device of the present invention is not limited in any way by this example.

On the optical-semiconductor-mounting substrate, there is disposed an optical semiconductor element 10 such as a separately prepared LED chip and the like (FIG. 2(b)). Hereat, an adhesive or a bonding member may be used in order to fix the optical semiconductor element 10.

Subsequently, as is shown in FIG. 2(c), a lead wire 16 is arranged to electrically connect the optical semiconductor element and the lead portion (electrode). At that time, in order to improve connection of the lead wire, it is preferable to heat the substrate at 100 to 250° C. for 5 to 20 minutes.

Thereafter, as is shown in FIG. 2(d), a sealing resin is filled in the cavity of the reflector and cured to prepare a sealed portion 22.

Next, as is shown in FIG. 2(e), the substrate is separated into individual pieces by a method such as dicing and the like at nearly the center (dotted line parts) of the reflector to obtain the semiconductor light-emitting device shown in FIG. 1. As necessary, the lens 18 can be arranged on the sealed portion 22. Meanwhile, in that case, the lens 18 may be mounted in an uncured state of the sealing resin and, thereafter, the sealing resin may be cured.

What is obtained by connecting and mounting the semiconductor light-emitting device on the wiring substrate 24 is shown in FIG. 2(f). The method for mounting the semiconductor light-emitting device on the wiring substrate is not particularly limited, but the mounting is preferably carried out by using molten solder. More specifically, there may be mentioned a method (solder reflow method) of mounting a semiconductor light-emitting device on a wiring substrate, wherein solder is disposed beforehand on the wiring substrate, and after loading a package on the solder, the assembly is heated by means of a reflow oven at 220 to 270° C., a melting temperature of general solder, to melt the solder. As the solder used in the method using solder, there can be used a publicly known one.

EXAMPLES

Next, the present invention will be described in more detail with reference to examples, but the present invention is not limited in any way by these examples.

(Preparation of Resin Composition for Reflector)

Production Example 1

To 100 parts by mass of polymethylpentene TPX RT 18 (produced by Mitsui Chemicals, Inc., weight average molecular weight=500,000 to 700,000) were added: 450 parts by mass of titanium oxide PF-691 (produced by Ishihara Sangyo Kaisha, Ltd., rutile type, average particle size=0.21 μm, hereinafter denoted as "$TiO_2$") and 120 parts by mass of glass fiber PF70E-001 (produced by Nittobo Co., Ltd., average fiber length=70 μm, average fiber diameter=10 μm) as inorganic substances; 20 parts by mass of triallyl isocyanate (produced by Nippon Kasei Chemical Co., Ltd., molecular weight=249.3, hereinafter denoted as "TAIC") as a cross-linking agent; 5 parts by mass of IRGANOX 1010 (produced by BASF Japan) and PEP-36 (produced by ADEKA Corporation) as antioxidants; 0.5 part by mass of SZ-2000 (produced by Sakai Chemical Industry Co., Ltd.) as a release agent; and 7 parts by mass of KBM-3063 (produced by Shin-Etsu Chemical Co., Ltd.) as a dispersant, and the mixture was kneaded to obtain a resin composition 1. In addition, kneading was carried out by Polylabo System (batch type, biaxial). The composition is described in Table 1.

Production Example 2

A resin composition 2 was obtained in the same manner as in Production Example 1, except that, in Production Example 1, the content of $TiO_2$ was changed to 350 parts by mass and that the amount of addition of the dispersant was changed to 5 parts by mass. As with Production Example 1, the composition is described in Table 1.

Production Example 3

A resin composition 3 was obtained in the same manner as in Production Example 1, except that, in Production Example 1, the content of $TiO_2$ was changed to 200 parts by mass, that the amount of addition of the dispersant was changed to 5 parts by mass, and that the amount of addition of TAIC was changed to 12 parts by mass. As with Production Example 1, the composition is described in Table 1.

Production Example 4

A resin composition 4 was obtained in the same manner as in Production Example 3, except that, in Production Example 3, the amount of addition of IRGANOX 1010 (produced by BASF Japan), an antioxidant, was changed to 1 part by mass and, further, IRGAFOS 168 (produced by BASF Japan) was added in an amount of 0.5 part by mass, and that KBM-303 (produced by Shin-Etsu Chemical Co., Ltd.) was added in an amount of 1 part by mass. As with Production Example 1, the composition is described in Table 1.

Production Example 5

A resin composition 5 was obtained in the same manner as in Production Example 1, except that, in Production Example 1, the amount of addition of TAIC was changed to 18 parts by mass. As with Production Example 1, the composition is described in Table 1.

Production Example 6

A resin composition 6 was obtained in the same manner as in Production Example 5, except that, in Production Example 5, SS05DE-413SP (produced by Nittobo Co., Ltd., average fiber length=100 μm, average fiber diameter=6 μm) was added as the glass fiber in an amount of 120 parts by mass in place of PF70E-001. As with Production Example 1, the composition is described in Table 1.

Production Example 7

A resin composition 7 was obtained in the same manner as in Production Example 6, except that, in Production Example 6, polymethylpentene TPX MX002 (produced by Mitsui Chemicals, Inc., weight average molecular weight=500,000 to 700,000) was used as the resin in place of polymethylpentene TPX RT18. As with Production Example 1, the composition is described in Table 1.

Production Example 8

A resin composition 8 was obtained in the same manner as in Production Example 5, except that, in Production Example 5, polymethylpentene TPX DX820 (produced by Mitsui Chemicals, Inc., weight average molecular weight=150,000 to 350,000) was used as the resin in place of polymethylpentene TPX RT18. As with Production Example 1, the composition is described in Table 1.

Production Example 9

A resin composition 9 was obtained in the same manner as in Production Example 5, except that, in Production Example 5, polymethylpentene TPX DX231 (produced by Mitsui Chemicals, Inc., weight average molecular weight=200,000 to 400,000) was used as the resin in place of polymethylpentene TPX RT18. The composition is described in Table 2.

Production Example 10

A resin composition 10 was obtained in the same manner as in Production Example 5, except that, in Production Example 5, polyethylene Hi-Zex 1300J (produced by Primer Polymer Co., Ltd.) was used as the resin in place of polymethylpentene TPX RT18. As with Production Example 9, the composition is described in Table 2.

Production Example 11

A resin composition 11 was obtained in the same manner as in Production Example 5, except that, in Production Example 5, polypropylene Prime Polypro J137G (produced by Prime Polymer Co., Ltd.) was used as the resin in place of polymethylpentene TPX RT18. As with Production Example 9, the composition is described in Table 2.

Comparative Production Example 1

A comparative resin composition 1 was obtained in the same manner as in Production Example 4, except that, in Production Example 4, glass fibers were not added. As with Production Example 9, the composition is described in Table 2.

Comparative Production Example 2

A comparative resin composition 2 was obtained in the same manner as in Production Example 4, except that, in Production Example 4, the amount of addition of $TiO_2$ was changed to 100 parts by mass, the content of TAIL was changed to 4 parts by mass, and glass fibers were not added. As with Production Example 9, the composition is described in Table 2.

Comparative Production Example 3

A comparative resin composition 3 was obtained in the same manner as in Production Example 4, except that, in Production Example 4, the amount of addition of $TiO_2$ was changed to 45 parts by mass, the content of TAIC was changed to 4 parts by mass and, as the glass fibers, glass fiber CSG3PA-820 (produced by Nittobo Co., Ltd., average fiber length=3 mm, irregular shape ratio=4) was added in an amount of 60 parts by mass. As with Production Example 9, the composition is described in Table 2.

Comparative Production Example 4

A comparative resin composition 4 was obtained in the same manner as in Production Example 1, except that, in Production Example 1, $TiO_2$ was not added and the content of TAIC was changed to 6 parts by mass. As with Production Example 9, the composition is described in Table 2.

Examples 1 to 11

The resin compositions 1 to 11 prepared in Production Examples 1 to 11 were respectively injection molded by means of an injection molding machine TR55EH (manufactured by Sodick Co., Ltd., screw diameter=φ22 mm) on a substrate (lead frame) (75 mm×62 mm×0.25 mm), which was made of copper and provided with silver plating as a light reflection layer, to obtain a molded body having a plurality of reflectors, each having external dimensions of 30 mm×30 mm, and a thickness of 0.35 mm. Conditions of the injection molding were respectively set suitably according to the resin composition in a cylinder temperature range of 220 and 320° C. and a mold temperature range of 20 to 150° C. Each molded body was irradiated with an electron beam at an acceleration voltage of 800 kV and an absorbed dose of 400 kGy to obtain an optical-semiconductor-mounting substrate.

On pad portions of each optical semiconductor mounting substrate prepared by the above procedures, LED elements (emitted light color: blue) prepared separately were mounted and were fixed by an adhesive. After connecting the LED elements and lead portions by lead wires, the substrate was separated into individual pieces by dicing to obtain the semiconductor light-emitting devices.

Comparative Examples 1 to 4

Optical-semiconductor-mounting substrates and semiconductor light-emitting devices were obtained in the same manner as in the Examples by using the comparative resin compositions 1 to 4 prepared in Comparative Production Examples 1 to 4.
(Evaluation Method)
(1) Diffraction Peak Intensity Ratio (P1/P2)

The optical-semiconductor-mounting substrate prepared in each Example and Comparative Example was placed on a sample table of an X-ray diffraction apparatus, and an X-ray diffraction measurement was performed under the following conditions. The measurement results are shown in Table 3 and Table 4.

X-Ray Diffraction Measurement Conditions:
Apparatus name; Smart Lab (manufactured by Rigaku Corporation)
Radiation source; CuKα radiation (wavelength=1.5418 Å)
Scanning axis; 2θ/θ
Tube voltage; 45 kV
Tube current; 200 mA
Slit; soller slit 5.0°
Scanning speed; 5.5°/min
Scanning step; 0.05°
(2) Ash Content The ash content was measured in the following manner based on Method A of JIS K 7250-1 (ISO 3451-1) (direct ashing method), using as a measurement sample the reflector cut out alone from the optical-semiconductor-mounting substrate prepared in each Example and Comparative Example.

First, a crucible was heated by means of a muffle furnace (FO310, manufactured by Yamato Scientific Co., Ltd.) heated to 800° C. until a constant weight was reached, and thereafter the crucible was cooled to room temperature in a desiccator. Subsequently, a mass of the crucible was measured to 0.1 mg by an electronic small balance (AG104, manufactured by Mettler Toledo International, Inc.). Then, a sample was pre-dried by a ventilating constant temperature and humidity dryer (DMK 400, manufactured by Yamato Scientific Co., Ltd.) at 60° C. for 2 to 5 hours. Thereafter, the whole amount was transferred to a crucible and the mass was measured to 0.1 mg by the electronic small balance. From this value, the mass of the crucible was subtracted, and the difference was taken as a mass of the sample before ashing. Thereafter, the crucible containing the sample was placed in the muffle furnace heated to 800° C., ashing was performed for 2 hours, and a mass after ashing was measured to 0.1 mg by the electronic small balance. From this value, the mass of the crucible is subtracted, and the difference was taken as a mass of the sample after ashing. A ratio of the mass of the sample after ashing to the mass of the sample before ashing was represented in percentage, which was taken as the ash content. The measurement results are shown in Table 3 and Table 4.
(3) Dimensional Stability An individual piece obtained by dicing the optical-semiconductor-mounting substrate prepared in each Example and Comparative Example was subjected to dimensional measurements in a longitudinal direction and a lateral direction by means of a digital microscope (VHX-1000, manufactured by Keyence Corporation) with magnification suitably adjusted. Then, the piece was heated on a hot plate with its surface temperature set at 265° C. for 20 seconds. An individual piece after heating was subjected dimensional measurements in a longitudinal direction and a lateral direction and, from a dimensional difference of the individual piece before and after the heating, a dimensional change ratio was calculated. The dimensional change ratio was calculated in the longitudinal direction and the lateral direction, respectively. Hereat, a result in the direction which showed a larger dimensional change was taken as dimensional stability. The measurement results are shown in Table 3 and Table 4. Leaving the above piece at 265° C. for 20 seconds is a condition assumed for a high heat treatment in mounting of a semiconductor light-emitting device on a wiring substrate, such as when the semiconductor light-emitting device is fixed by melting solder by heating.
(4) Reflectance The semiconductor light-emitting device prepared in each Example and Comparative Example was subjected to a measurement of light reflectance of the reflector portion at a wavelength of 230 to 780 nm by using a reflectance measuring apparatus MCPD-9800 (manufactured by Otsuka Electronics Co., Ltd.). Results of reflectance at a wavelength of 450 nm are shown in Table 3 and Table 4.

(5) High Temperature and High Humidity Operation Test

Solder was applied on a wiring substrate, and on the solder was loaded the semiconductor light-emitting device prepared in each Example and Comparative Example, and the substrate was heated to 240° C. by a reflow furnace to melt the solder. Thus, the semiconductor light-emitting device was mounted on the wiring substrate. Luminous flux, when the semiconductor light-emitting device mounted on the wiring substrate was made to emit light by a constant electric current of 200 mA, was measured by an instantaneous multi-photometric system (wide dynamic range type) MCPD-9800 (manufactured by Otsuka Electronics Co., Ltd.), which was taken as an initial luminous flux ($\Phi_0$). Furthermore, the same semiconductor light-emitting device was made to emit light continuously at a constant electric current of 200 mA under an environment of a temperature of 85° C. and a humidity of 85% RH. After 500 accumulated hours have passed, luminous flux, when the semiconductor light-emitting device was made to emit light by a constant electric current of 200 mA, was measured by an instantaneous multi-photometric system (wide dynamic range type) MCPD-9800 (manufactured by Otsuka Electronics Co., Ltd.), which was taken as a luminous flux after 500 hours ($\Phi_{500}$).

From the measured initial luminous flux ($\Phi_0$) and luminous flux after 500 hours ($\Phi_{500}$), a luminous flux deterioration rate was calculated according to the following formula A.

$$\text{Luminous flux deterioration rate (\%)} = |(\Phi_{500} - \Phi_0)/\Phi_0 \times 100| \quad \text{(Formula A)}$$

The luminous flux deterioration rates calculated from initial luminous flux ($\Phi_0$) and luminous flux after 500 hours ($\Phi_{500}$) are shown in Table 3 and Table 4.

TABLE 1

| | | | Production Example | | | | | | | | |
|---|---|---|---|---|---|---|---|---|---|---|---|
| | Producer | Material name | 1 | 2 | 3 | 4 | 5 | 6 | 7 | 8 |
| Resin | Mitsui Chemicals | Polymethylpentene TPX RT18 | 100 | 100 | 100 | 100 | 100 | 100 | | |
| | | Polymethylpentene TPX MX002 | | | | | | | 100 | |
| | | Polymethylpentene TPX DX820 | | | | | | | | 100 |
| | | Polymethylpentene TPX DX231 | | | | | | | | |
| | Prime Polymer | Polyethylene Hi-Zex 1300J | | | | | | | | |
| | | Polypropylene Prime Polypro J137G | | | | | | | | |
| Titanium oxide | Ishihara Sangyo | PF-691 | 450 | 350 | 200 | 200 | 450 | 450 | 450 | 450 |
| Glass fiber | Nittobo | PF 70E-001 | 120 | 120 | 120 | 120 | 120 | | | 120 |
| | | SS05DE-413SP | | | | | | 120 | | |
| | | CSG3PA-820 | | | | | | | 120 | |
| Dispersant | Shin-Etsu Chemical | KBM-3063 | 7 | 5 | 5 | | 7 | 7 | 7 | 7 |
| | | KBM-303 | | | | 1 | | | | |
| Cross-linking agent | Nippon Kasei | TAIC | 20 | 20 | 12 | 12 | 18 | 18 | 18 | 18 |
| Release agent | Sakai Chemical | SZ-2000 | 0.5 | 0.5 | 0.5 | 0.5 | 0.5 | 0.5 | 0.5 | 0.5 |
| Additive | BASF Japan | IRGANOX 1010 | 5 | 5 | 5 | 1 | 5 | 5 | 5 | 5 |
| | | IRGAFOS 168 | | | | 0.5 | | | | |
| | ADEKA | PEP-36 | 0.5 | 0.5 | 0.5 | | 0.5 | 0.5 | 0.5 | 0.5 |

TABLE 2

| | | | Production Example | | | Comparative Production Example | | | |
|---|---|---|---|---|---|---|---|---|---|
| | Producer | Material name | 9 | 10 | 11 | 1 | 2 | 3 | 4 |
| Resin | Mitsui Chemicals | Polymethylpentene TPX RT18 | | | | 100 | 100 | 100 | 100 |
| | | Polymethylpentene TPX MX002 | | | | | | | |
| | | Polymethylpentene TPX DX820 | | | | | | | |
| | | Polymethylpentene TPX DX231 | 100 | | | | | | |
| | Prime Polymer | Polyethylene Hi-Zex 1300J | | 100 | | | | | |
| | | Polypropylene Prime Polypro J137G | | | 100 | | | | |
| Titanium oxide | Ishihara Sangyo | PF-691 | 450 | 450 | 450 | 200 | 100 | 45 | 0 |
| Glass fiber | Nittobo | PF 70E-001 | 120 | 120 | 120 | | | | 120 |
| | | SS05DE-413SP | | | | | | | |
| | | CSG3PA-820 | | | | | | 60 | |
| Dispersant | Shin-Etsu Chemical | KBM-3063 | 7 | 7 | 7 | | | | 7 |
| | | KBM-303 | | | | 1 | 1 | 1 | |

TABLE 2-continued

|  | Producer | Material name | Production Example | | | Comparative Production Example | | | |
|---|---|---|---|---|---|---|---|---|---|
|  |  |  | 9 | 10 | 11 | 1 | 2 | 3 | 4 |
| Cross-linking agent | Nippon Kasei | TAIC | 18 | 18 | 18 | 12 | 4 | 4 | 6 |
| Release agent | Sakai Chemical | SZ-2000 | 0.5 | 0.5 | 0.5 | 0.5 | 0.5 | 0.5 | 0.5 |
| Additive | BASF Japan | IRGANOX 1010 | 5 | 5 | 5 | 1 | 1 | 1 | 5 |
|  |  | IRGAFOS 168 |  |  |  | 0.5 | 0.5 | 0.5 |  |
|  | ADEKA | PEP-36 | 0.5 | 0.5 | 0.5 |  |  |  | 0.5 |

TABLE 3

|  |  | Example | | | | | | | |
|---|---|---|---|---|---|---|---|---|---|
|  |  | 1 | 2 | 3 | 4 | 5 | 6 | 7 | 8 |
| Result | Diffraction peak intensity ratio (P1/P2) | 0.14 | 0.3 | 0.66 | 0.66 | 0.14 | 0.16 | 0.12 | 0.16 |
|  | Ash content (%) | 81 | 78 | 72 | 74 | 81 | 81 | 81 | 81 |
|  | Dimensional stability (%) | 0.2 | 0.2 | 0.9 | 0.8 | 0.2 | 0.2 | 0.3 | 0.4 |
|  | Reflectance (%) | 95.9 | 95.6 | 94.6 | 93.8 | 96.0 | 97.5 | 96.9 | 95.1 |
|  | Initial luminous flux (lm) | 8.41 | 8.55 | 7.81 | 7.75 | 8.44 | 8.69 | 8.51 | 7.95 |
|  | Luminous flux deterioration ratio (%) | 0.2 | 1.4 | 2 | 2.6 | 0.2 | 0.1 | 1.6 | 1.8 |

TABLE 4

|  |  | Example | | | Comparative Example | | | |
|---|---|---|---|---|---|---|---|---|
|  |  | 9 | 10 | 11 | 1 | 2 | 3 | 4 |
| Result | Diffraction peak intensity ratio (P1/P2) | 0.16 | 0.71 | 0.31 | 0.66 | 2.8 | 11.68 | — |
|  | Ash content (%) | 81 | 81 | 81 | 48 | 48 | 50 | 50 |
|  | Dimensional stability (%) | 0.4 | 0.8 | 0.8 | 10 or more | 10 or more | 10 or more | 10 or more |
|  | Reflectance (%) | 95.2 | 94.0 | 94.0 | 91.3 | 90.0 | 89.0 | 46.0 |
|  | Initial luminous flux (lm) | 8.02 | 7.55 | 7.68 | 7.70 | 7.40 | 7.24 | — |
|  | Luminous flux deterioration ratio (%) | 1.7 | 3.0 | 2.8 | 10 or more | 10 or more | 10 or more | — |

Examples 1 to 11 showed dimensional stability of 1% or less, reflectance of 90% or more, and luminous flux deterioration rates after the high temperature and high humidity operation test of 3% or less. Thus, good performance of each as a semiconductor light-emitting device was obtained.

On the other hand, Comparative Examples 1 to 3 showed dimensional stability of 10% or more and luminous flux deterioration rates after the high temperature and high humidity operation tests of 10% or more. Thus, none could satisfy sufficient performance as a semiconductor light-emitting device. Furthermore, Comparative Example 4 showed dimensional stability of 10% or more and reflectance of 46%, thus it could not satisfy sufficient performance as a semiconductor light-emitting device.

From the above results, there is realized an excellent semiconductor light-emitting device, which has high dimensional stability, and high reliability and little luminous flux deterioration even when used under a high temperature and high humidity environment for a long period, by a semiconductor light-emitting device comprising at least a substrate, a reflector having a concave cavity, and an optical semiconductor element, wherein the reflector is formed of a resin composition containing an inorganic substance; in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of diffraction angle 2θ of 0° to 24° to the peak intensity P2 of the highest intensity diffraction peak in a range of diffraction angle 2θ of more than 24° to 70° is 0.01 or more and 1.0 or less; and an ash content of the reflector is 60% by mass or more.

INDUSTRIAL APPLICABILITY

According to the present invention, there can be provided a semiconductor light-emitting device and an optical-semiconductor-mounting substrate, wherein a reflector has an extremely high light reflection property and excellent dimensional stability.

REFERENCE SIGNS LIST

1: Semiconductor light-emitting device
10: Semiconductor element
12: Reflector
13a: Pad portion
13b: Lead portion
14: Substrate (metal frame, lead frame)
15: Insulating portion
16: Lead wire
18: Lens
22: Sealing portion
24: Printing wire substrate

The invention claimed is:
1. A semiconductor light-emitting device comprising:
a substrate;
a reflector having a concave cavity; and an optical semiconductor element, wherein:
  the reflector is formed of a resin composition containing an inorganic substance and at least one of polymethylpentene, polyethylene, or polypropylene;
  the reflector has a reflectance of 90% or more;
  in a spectrum obtained when the reflector is measured by an X-ray diffraction method using CuKα radiation (wavelength=1.5418 A), an intensity ratio (P1/P2) of a peak intensity P1 of a highest intensity diffraction peak in a range of a first diffraction angle 2θ of 0° to 24° to the peak intensity P2 of the highest intensity diffraction peak in a range of a second diffraction angle 2θ of more than 24° to 70° is 0.01 or more and 1.0 or less; and
  an ash content of the reflector is 60% by mass or more, which reflects a weight ratio of the inorganic substance in the resin composition that forms the reflector.

2. The semiconductor light-emitting device according to claim 1, wherein, among the diffraction peaks in a range of the first diffraction angle 2θ of 0° to 24°, the highest intensity diffraction peak is any one of peaks at 2θ=9.3±1°, 13.4±1°, 16.7±1°, and 18.3±1°.

3. The semiconductor light-emitting device according to claim 1, wherein, in a range of the second diffraction angle 2θ of more than 24° to 70°, the highest intensity diffraction peak is any one of peaks at 2θ=27.4±1°, 36.1±1°, 41.2±1°, 54.3±1°, 56.6±1°, 69.0±1°, 25.3±1°, 37.9±1°, 48.1±1°, 54.0±1°, 55.1±1°, 62.7±1°, 25.7±1°, 30.8±1°, 36.3±1°, 48.0±1°, 54.2±1°, and 55.2±1°.

4. The semiconductor light-emitting device according to claim 1, wherein the diffraction peaks in a range of the first diffraction angle 2θ of 0° to 24° include a combination of diffraction peaks at least at 2θ=9.3±1°, 13.4±1°, 16.7±1°, and 18.3±1°.

5. The semiconductor light-emitting device according to claim 1, wherein the diffraction peaks in a range of the second diffraction angle 2θ of more than 24° to 70° include any one of the following combinations (1) to (3):
  (1) a combination of diffraction peaks at least at 2θ=27.4±1°, 36.1±1°, 41.2±1°, 54.3±1°, 56.6±1°, and 69.0±1°;
  (2) a combination of diffraction peaks at least at 2θ=25.3±1°, 37.9±1°, 48.1±1°, 54.0±1°, 55.1±1°, and 62.7±1°; and
  (3) a combination of diffraction peaks at least at 2θ=25.3±1°, 25.7±1°, 30.8±1°, 36.3±1°, 48.0±1°, 54.2±1°, and 55.2±1°.

6. The semiconductor light-emitting device according to claim 1, wherein, in a range of the first diffraction angle 2θ of 0° to 24°, the highest intensity diffraction peak is a peak at 2θ=9.3±1°.

7. The semiconductor light-emitting device according to claim 1, wherein, in a range of the second diffraction angle 2θ of more than 24° to 70°, the highest intensity diffraction peak is a peak at 2θ=27.4±1°.

8. The semiconductor light-emitting device according to claim 1, wherein the optical semiconductor element is an LED element.

9. The semiconductor light-emitting device according to claim 1, wherein the cavity of the reflector is filled with a sealing resin.

10. The semiconductor light-emitting device according to claim 1, wherein the resin composition further contains a cross-linking agent.

11. An optical-semiconductor-mounting substrate comprising:
  a substrate; and
  a reflector having a concave cavity, wherein:
    the reflector is formed of a resin composition containing an inorganic substance and at least one of polymethylpentene, polyethylene, or polypropylene;
    the reflector has a reflectance of 90% or more;
    in a spectrum obtained when the reflector is measured by an X-ray diffraction method using CuKα radiation (wavelength=1.5418 A), an intensity ratio (P1/P2) of a peak intensity P1 of the highest intensity diffraction peak in a range of a first diffraction angle 2θ of 0° to 24° to the peak intensity P2 of the highest intensity diffraction peak in a range of a second diffraction angle 2θ of more than 24° to 70° is 0.01 or more and 1.0 or less; and
    an ash content of the reflector is 60% by mass or more, which reflects a weight ratio of the inorganic substance in the resin composition that forms the reflector.

12. The optical-semiconductor-mounting substrate according to claim 11, wherein, among the diffraction peaks in a range of the first diffraction angle 2θ of 0° to 24°, the highest intensity diffraction peak is any one of peaks at 2θ=9.3±1°, 13.4±1°, 16.7±1°, and 18.3±1°.

13. The optical-semiconductor-mounting substrate according to claim 11, wherein, in a range of the second diffraction angle 2θ of more than 24° to 70°, the highest intensity diffraction peak is any one of peaks at 2θ=27.4±1°, 36.1±1°, 41.2±1°, 54.3±1°, 56.6±1°, 69.0±1°, 25.3±1°, 37.9±1°, 48.1±1°, 54.0±1°, 55.1±1°, 62.7±1°, 25.7±1°, 30.8±1°, 36.3±1°, 48.0±1°, 54.2±1°, and 55.2±1°.

14. The optical-semiconductor-mounting substrate according to claim 11, wherein the diffraction peaks in a range of the first diffraction angle 2θ of 0° to 24° include a combination of diffraction peaks at least at 2θ=9.3±1°, 13.4±1°, 16.7±1°, and 18.3±1°.

15. The optical-semiconductor-mounting substrate according to claim 11, wherein the diffraction peaks in a range of the second diffraction angle 2θ of more than 24° to 70° include any one of the following combinations (1) to (3):
  (1) a combination of diffraction peaks at least at 2θ=27.4±1°, 36.1±1°, 41.2±1°, 54.3±1°, 56.6±1°, and 69.0±1°;
  (2) a combination of diffraction peaks at least at 2θ=25.3±1°, 37.9±1°, 48.1±1°, 54.0±1°, 55.1±1°, and 62.7±1°; and
  (3) a combination of diffraction peaks at least at 2θ=25.3±1°, 25.7±1°, 30.8±1°, 36.3±1°, 48.0±1°, 54.2±1°, and 55.2±1°.

16. The optical-semiconductor-mounting substrate according to claim 11, wherein, in a range of the first diffraction angle 2θ of 0° to 24°, the highest intensity diffraction peak is a peak at 2θ=9.3±1°.

17. The optical-semiconductor-mounting substrate according to claim 11, wherein, in a range of the second diffraction angle 2θ of more than 24° to 70°, the highest intensity diffraction peak is a peak at 2θ=27.4±1°.

18. The optical-semiconductor-mounting substrate according to claim 11, wherein the cavity of the reflector is filled with a sealing resin.

19. The optical-semiconductor-mounting substrate according to claim 11, wherein the resin composition further contains a cross-linking agent.

20. The semiconductor light-emitting device according to claim 1, wherein the inorganic substance includes titanium oxide and glass fiber.

21. The semiconductor light-emitting device according to claim 1, wherein the resin composition further contains a cross-linking agent having a saturated or unsaturated cyclic structure wherein at least one atom among atoms forming at least one ring is bonded to any of an allyl group, a methacryl group, an allyl group via a linking group, or a methacryl group via a linking group.

22. The semiconductor light-emitting device according to claim 1, wherein the resin composition further contains a cross-linking agent comprising triallyl isocyanurate, methyldiallyl isocyanurate, diallylmonoglycidyl isocyanurate, monoallyldiglycidyl isocyanurate, trimethallyl isocyanurate, a diallyl ester of orthophthalic acid, or a diallyl ester of isophthalic acid.

23. A semiconductor light-emitting device comprising:
a substrate;
a reflector having a concave cavity; and
an optical semiconductor element, wherein:
   the reflector is formed of a resin composition containing an inorganic substance and polymethylpentene;
   the reflector has a reflectance of 90% or more;
   in a spectrum obtained when the reflector is measured by an X-ray diffraction method using CuKα radiation (wavelength=1.5418 A), an intensity ratio (P1/P2) of a peak intensity P1 of a highest intensity diffraction peak in a range of a first diffraction angle $2\theta$ of $0°$ to $24°$ to the peak intensity P2 of the highest intensity diffraction peak in a range of a second diffraction angle $2\theta$ of more than $24°$ to $70°$ is 0.01 or more and 1.0 or less;
   among the diffraction peaks in the range of the first diffraction angle $2\theta$ of $0°$ to $24°$, the highest intensity diffraction peak is any one of peaks at $2\theta=9.3\pm1°$, $13.4\pm1°$, $16.7\pm1°$, and $18.3\pm1°$; and
   an ash content of the reflector is 60% by mass or more, which reflects a weight ratio of the inorganic substance in the resin composition that forms the reflector.

24. The semiconductor light-emitting device according to claim 23, wherein the polymethylpentene is a homopolymer.

* * * * *